United States Patent
Motomura et al.

(10) Patent No.: US 9,287,682 B2
(45) Date of Patent: Mar. 15, 2016

(54) SURFACE EMITTING LASER DEVICE AND ATOMIC OSCILLATOR

(71) Applicants: Hiroshi Motomura, Miyagi (JP); Shunichi Sato, Miyagi (JP)

(72) Inventors: Hiroshi Motomura, Miyagi (JP); Shunichi Sato, Miyagi (JP)

(73) Assignee: RICOH COMPANY, LTD., Tokyo (JP)

(*) Notice: Subject to any disclaimer, the term of this patent is extended or adjusted under 35 U.S.C. 154(b) by 216 days.

(21) Appl. No.: 14/069,541

(22) Filed: Nov. 1, 2013

(65) Prior Publication Data
US 2014/0152393 A1    Jun. 5, 2014

(30) Foreign Application Priority Data
Nov. 30, 2012 (JP) .................... 2012-262757

(51) Int. Cl.
| | |
|---|---|
| H01S 5/183 | (2006.01) |
| H01S 5/42 | (2006.01) |
| G04F 5/14 | (2006.01) |
| H01S 5/40 | (2006.01) |

(52) U.S. Cl.
CPC .............. *H01S 5/18355* (2013.01); *G04F 5/14* (2013.01); *G04F 5/145* (2013.01); *H01S 5/18377* (2013.01); *H01S 5/18394* (2013.01); *H01S 5/423* (2013.01); *H01S 5/1835* (2013.01); *H01S 5/18347* (2013.01); *H01S 5/4087* (2013.01)

(58) Field of Classification Search
CPC .......... H01S 5/183; H01S 5/34; H01S 5/1855
USPC .................... 331/94.1; 372/44.011
See application file for complete search history.

(56) References Cited

U.S. PATENT DOCUMENTS

| | | | |
|---|---|---|---|
| 7,684,458 B2 | 3/2010 | Sato et al. | |
| 7,693,204 B2 | 4/2010 | Sato et al. | |
| 7,720,125 B2 | 5/2010 | Jikutani et al. | |
| 7,746,912 B2 | 6/2010 | Motomura et al. | |
| 7,957,444 B2 | 6/2011 | Itoh et al. | |
| 7,978,739 B2 | 7/2011 | Sugawara et al. | |
| 7,981,700 B2 | 7/2011 | Sato et al. | |
| 8,035,676 B2 | 10/2011 | Harasaka et al. | |
| 8,089,498 B2 | 1/2012 | Sato et al. | |
| 8,111,725 B2 | 2/2012 | Ishii et al. | |
| 8,179,414 B2 | 5/2012 | Sato et al. | |
| 8,208,511 B2 | 6/2012 | Sato et al. | |
| 8,416,822 B2 | 4/2013 | Shouji et al. | |
| 8,421,837 B2 | 4/2013 | Itoh et al. | |

(Continued)

FOREIGN PATENT DOCUMENTS

| | | |
|---|---|---|
| JP | 2751814 | 5/1998 |
| JP | 11-243257 | 9/1999 |

(Continued)

*Primary Examiner* — Jeffrey Shin
(74) *Attorney, Agent, or Firm* — Cooper & Dunham LLP (57) ABSTRACT

Disclosed is a surface emitting laser device, including a substrate; a lower reflecting mirror provided on the substrate; an active layer provided on the lower reflecting mirror; an upper reflecting mirror provided on the active layer, including an emitting region, laser light being emitted from the emitting region, the upper reflecting mirror being formed by alternately laminating dielectrics, refracting indices of the dielectrics being different from each other; and an adjusting layer formed of semiconductor, provided in the emitting region between the active layer and the upper reflecting mirror, a shape of the adjusting layer in a plane parallel to a surface of the substrate including shape anisotropy in two mutually perpendicular directions.

13 Claims, 9 Drawing Sheets

(56) References Cited

U.S. PATENT DOCUMENTS

| | | |
|---|---|---|
| 8,441,511 B2 | 5/2013 | Harasaka et al. |
| 2006/0193361 A1* | 8/2006 | Casimirus et al. ............. 372/68 |
| 2008/0055672 A1 | 3/2008 | Watanabe et al. |
| 2009/0180506 A1* | 7/2009 | Maeda et al. ............. 372/44.01 |
| 2009/0295902 A1 | 12/2009 | Sato et al. |
| 2009/0303308 A1* | 12/2009 | Itoh et al. ...................... 347/256 |
| 2010/0328747 A1 | 12/2010 | Jikutani et al. |
| 2011/0037825 A1 | 2/2011 | Jikutani et al. |
| 2011/0109395 A1* | 5/2011 | Chindo ........................ 331/94.1 |
| 2011/0116147 A1 | 5/2011 | Motomura et al. |
| 2011/0128343 A1 | 6/2011 | Sato et al. |
| 2011/0170155 A1 | 7/2011 | Jikutani et al. |
| 2011/0176122 A1 | 7/2011 | Kaminishi et al. |
| 2011/0217077 A1 | 9/2011 | Harasaka et al. |
| 2011/0228035 A1 | 9/2011 | Ishii et al. |
| 2011/0261850 A1 | 10/2011 | Shouji et al. |
| 2011/0304684 A1 | 12/2011 | Numata et al. |
| 2012/0057902 A1 | 3/2012 | Shouji et al. |
| 2012/0121297 A1 | 5/2012 | Jikutani et al. |
| 2012/0251182 A1 | 10/2012 | Adachi et al. |
| 2012/0294652 A1 | 11/2012 | Itoh et al. |
| 2013/0070039 A1 | 3/2013 | Harasaka et al. |

FOREIGN PATENT DOCUMENTS

| | | |
|---|---|---|
| JP | 2008-098338 | 4/2008 |
| JP | 2011-108796 | 6/2011 |
| JP | 2011-129866 | 6/2011 |
| JP | 2011-129869 | 6/2011 |
| JP | 2011-135030 | 7/2011 |
| JP | 2011-181786 | 9/2011 |
| JP | 2012-009818 | 1/2012 |

* cited by examiner

SURFACE EMITTING LASER DEVICE AND ATOMIC OSCILLATOR

BACKGROUND OF THE INVENTION

1. Field of the Invention

The disclosures herein relate to a surface emitting laser device and an atomic oscillator.

2. Description of the Related Art

A vertical cavity surface emitting laser (VCSEL) is a semiconductor laser, which emits light in a direction perpendicular to a substrate surface. The VCSEL has a feature, compared with an end-face emitting type semiconductor laser, of low cost, low power consumption, small size, high performance, and being easy to be integrated two-dimensionally.

The vertical cavity surface emitting laser has a resonator structure that has a resonator region including an active layer. The resonator structure also has an upper reflecting mirror and a lower reflecting mirror provided above and below the resonator region respectively. The resonator region has a predetermined optical thickness so that light with wavelength of $\lambda$ resonates in the resonator region in order to obtain light with an oscillating wavelength of $\lambda$. The upper and lower reflecting mirrors are formed by laminating materials having different refraction indices, i.e. a low refraction index material and a high refraction index material, alternately, and are formed so that the optical thickness of the low and high refraction index materials is $\lambda/4$, in order to obtain high reflectance where the wavelength is $\lambda$.

These upper and lower reflecting mirrors are formed with a distributed Bragg reflector (DBR), and, for example, in the case where GaAs substrate is used as the substrate, AlGaAs-based material, which is easily lattice-matched with the GaAs substrate, is often used. Generally, in a normal surface emitting laser, the lower reflecting mirror is often formed of an n-type material and the upper reflecting mirror is often formed of a p-type material.

The p-type semiconductor has high optical absorption according to inter-valence absorption and absorption between valence band acceptor levels. Because of this, a surface emitting laser using a p-type semiconductor layer for the light wave guide region may suffer an increase in threshold current, a decrease in external quantum efficiency, and degradation in temperature characteristics.

Japanese Published Patent Application No. H11-243257 discloses a surface emitting laser having a structure using DBRs including dielectric material instead of the semiconductor material. In this case, since the dielectric material is an insulating material, providing a current path bypassing the DBR formed of the dielectric material is necessary. Such a structure is generally called an intra-cavity type. Furthermore, in the DBR formed of the dielectric materials, difference in refraction index between the high refraction index material and the low refraction index material forming the DBR is larger than that formed of the semiconductor materials. Accordingly, the DBR formed of the dielectric materials can obtain a high reflection rate even with a small number of pairs, compared with the DBR formed of the semiconductor materials. Therefore, the surface emitting laser has an advantage that the size in the laminating direction becomes small.

Furthermore, a structure in which a multi-wavelength surface emitting laser with different wavelengths is formed in one chip is also disclosed, and is expected to be widely used for multi-wavelength communication and the like. As a method of obtaining such a multi-wavelength surface emitting laser device, Japanese Patent No. 2751814 discloses, for example, a structure, in which an oscillator region of the surface emitting laser is formed with a wavelength adjusting layer formed by alternately laminating two kinds of layer which are etched by different kinds of etching liquid. Specifically, the structure is obtained by removing one layer for each surface emitting laser by wet etching, thereby changing a layer thickness of the wavelength adjusting layer, and the layer thickness in the resonator region is changed for each surface emitting laser. The surface emitting laser produced by such a method is regarded as preferable from a viewpoint of controllability of wavelength of laser light emitted from the surface emitting laser and from a viewpoint of productivity.

In an apparatus where the surface emitting laser is used, light emitted from the surface emitting laser (emitted light) may be required to have a polarization of a predetermined direction. However, since the surface emitting laser is different in structure from the end-face emitting laser, it is difficult to set the polarization in the predetermined direction. Accordingly, a variety of methods of setting polarization in a predetermined direction have been studied. For example, Japanese Published Patent Application No. 2008-98338 discloses a surface emitting laser, in which on an active layer, a stress adding layer applying stress in a predetermined direction within a laminating surface to the active layer is formed. However, in such a surface emitting laser, since polarization direction is controlled by the stress in the layer, there is a problem that the polarization direction is not sufficiently stabilized.

The present invention has been made in view of the above circumstances, and it is a general object of at least one embodiment of the present invention to provide a surface emitting laser device which emits laser light with stable polarization in a predetermined direction.

SUMMARY OF THE INVENTION

According to an aspect of the exemplary embodiment of the present application, a surface emitting laser device includes: a substrate; a lower reflecting mirror provided on the substrate; an active layer provided on the lower reflecting mirror; an upper reflecting mirror provided on the active layer, the upper reflecting mirror being formed by alternately laminating dielectrics, refracting indices of the dielectrics being different from each other; and an adjusting layer formed of semiconductor, provided in an emitting region between the active layer and the upper reflecting mirror, laser light being emitted from the emitting region. A shape of the adjusting layer in a plane parallel to a surface of the substrate has shape anisotropy in two mutually perpendicular directions.

According to another aspect of the exemplary embodiment of the present application, a surface emitting laser device includes: a substrate; a lower reflecting mirror provided on the substrate; an active layer provided on the lower reflecting mirror; a first upper reflecting mirror provided on the active layer, the first upper reflecting mirror being formed by alternately laminating semiconductors, refracting indices of the semiconductors being different from each other; a second upper reflecting mirror provided on the first upper reflecting mirror, the second upper reflecting mirror being formed by alternately laminating dielectrics, refracting indices of the dielectrics being different from each other; and an adjusting layer formed of semiconductor, provided in an emitting region between the first upper reflecting mirror and the second upper reflecting mirror, laser light being emitted from the emitting region. A shape of the adjusting layer in a plane parallel to a surface of the substrate has shape anisotropy in two mutually perpendicular directions.

According to yet another aspect of the exemplary embodiment of the present application, an atomic oscillator includes: the surface emitting laser device including a substrate; a lower reflecting mirror provided on the substrate; an active layer provided on the lower reflecting mirror; an upper reflecting mirror provided on the active layer, the upper reflecting mirror being formed by alternately laminating dielectrics, refracting indices of the dielectrics being different from each other; and an adjusting layer formed of semiconductor, provided in an emitting region between the active layer and the upper reflecting mirror, laser light being emitted from the emitting region; an alkali metal cell that encapsulates alkali metal; a light detecting unit that detects light transmitted through the alkali metal cell, the light being emitted from a surface emitting laser of the surface emitting laser device; and a modulating unit that modulates the surface emitting laser device. A shape of the adjusting layer in a plane parallel to a surface of the substrate has shape anisotropy in two mutually perpendicular directions. A signal outputted from the light detecting unit is transmitted to the modulating unit, and the modulating unit modulates the surface emitting laser device with a modulating frequency, which is determined based on a transmitted light quantity detected by the light detecting unit.

According to the present invention, a surface emitting laser device, which emits laser light with a stable polarization in a predetermined direction, can be provided.

BRIEF DESCRIPTION OF THE DRAWINGS

Other objects and further features of embodiments will be apparent from the following detailed description when read in conjunction with the accompanying drawings.

DESCRIPTION OF THE PREFERRED EMBODIMENTS

In the following, embodiments of the present invention will be described with reference to the accompanying drawings. Meanwhile, the same numerical symbols are assigned to the same members, and explanation is omitted.

First Exemplary Embodiment

Figure 1A:
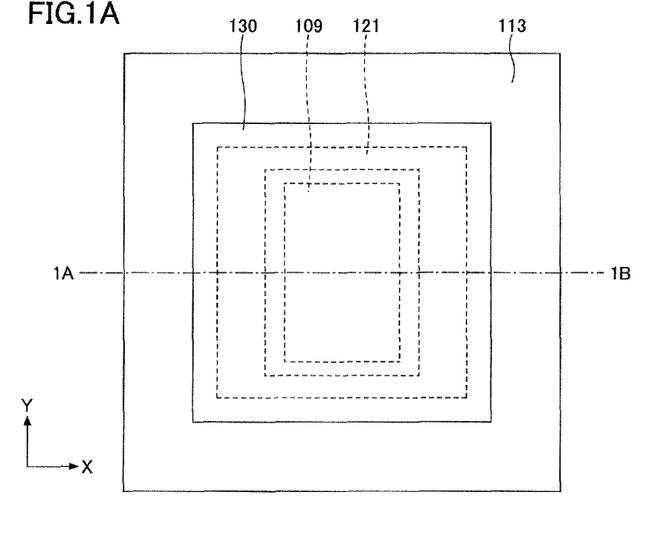
FIG. 1A is a top view illustrating a surface emitting laser according to a first exemplary embodiment.
Figure 1B:
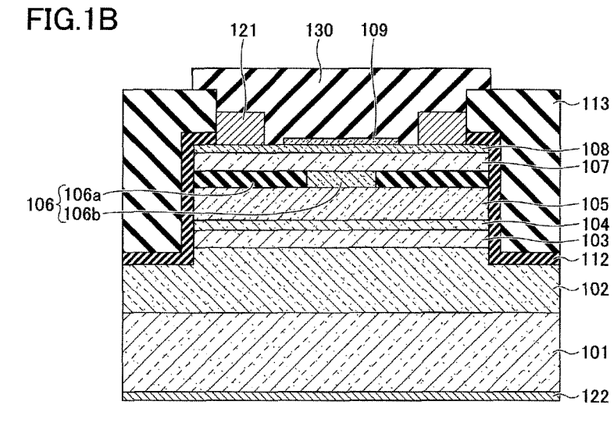
FIG. 1B is a cross-sectional diagram illustrating the surface emitting laser according to the first exemplary embodiment.

A surface emitting laser according to the first exemplary embodiment is explained based on FIGS. 1A and 1B. Meanwhile, FIG. 1A is a top view of the surface emitting laser according to the present exemplary embodiment, FIG. 1B is a cross-sectional diagram illustrating a cross section cut at a dot-dashed line 1A-1B in FIG. 1A. Furthermore, the surface emitting laser, explained in the present exemplary embodiment, is a surface emitting laser with the oscillating wavelength band of 895 nm. Furthermore, in the present application, the surface emitting laser or the surface emitting laser array may be denoted as a surface emitting laser device.

The surface emitting laser according to the present exemplary embodiment is formed by laminating, on a substrate 101 including a semiconductor or the like, a lower reflecting mirror 102, a spacer layer 103, an active layer 104, an electric current narrowing layer 106, a spacer layer 107, a contact layer 108, and an adjusting layer 109. Moreover, in the present exemplary embodiment, the spacer layer 103 corresponds to the lower spacer layer, the spacer layers 105 and 107 correspond to the upper spacer layer, and the electric current narrowing layer 106 is formed in a part of the upper spacer layer. Furthermore, semiconductor layers such as the lower reflecting layer 102, the spacer layer 103, the active layer 104, the spacer layer 105, the electric current narrowing layer 106, the spacer layer 107, the contact layer 108, and the adjusting layer 109 are formed by the epitaxial growth. Specifically, these semiconductor layers are formed by epitaxial growth according to Metal Organic Chemical Vapor Deposition (MOCVD) or Molecular Beam Epitaxy (MBE).

For the substrate 101, an n-GaAs substrate is used. The lower reflecting mirror 102 is formed with a semiconductor multiple layer. Specifically, 35.5 pairs of a high refraction index layer including n-$Al_{0.16}Ga_{0.84}As$ with an optical thickness of $\lambda/4$ and a low refraction index layer including n-$Al_{0.9}Ga_{0.1}As$ with an optical thickness of $\lambda/4$ are alternately laminated.

The spacer layers 103, 105 and 107 are formed of $Al_{0.2}Ga_{0.8}As$, the active layer 104 is formed by alternately laminating a GaInAs quantum well layer and a GaInPAs barrier layer. Furthermore, the contact layer 108 is formed of p-GaAs. The adjusting layer 109 is formed of GaInP in a predetermined region on the contact layer 108. Moreover, the resonator region is formed with the spacer layer 103, the active layer 104, the spacer layer 105, the electric current narrowing layer 106, the spacer layer 107, the contact layer 108 and the adjusting layer 109. The resonator region is formed so that an optical thickness of the resonator region is almost three times the wavelength. The adjusting layer 109 is formed by removing a region where the upper electrode 121 is formed. In the region where the adjusting layer 109 is removed, the contact layer 108 is exposed. On the exposed part of the contact layer 108, the upper electrode 121, which will be described later, is formed.

Specifically, the adjusting layer 109 is formed by laminating the semiconductor layers up to the GaInP layer so as to form the adjusting layer 109, then forming a resist pattern in the region where the adjusting layer 109 is formed, and removing the GaInP layer of the region where the resist pattern is not formed. The GaInP layer is removed by dry etching, wet etching or the like. The adjusting layer 109, formed as above, is formed so as to have a central region of an approximately rectangular shape. Moreover, in a plane parallel to the surface of the substrate 101, the approximately rectangular shape in the formed adjusting layer 109 is formed so that a length in the Y-axis direction is longer and a length in the X-axis direction is shorter.

Subsequently, the resist pattern is formed for forming a mesa on the contact layer 108 and the adjusting layer 109. Then, the semiconductor layer of the region where the resist pattern is not formed is partially removed by the etching. Specifically, a part of the contact layer 108, the spacer layer 107, the current narrowing layer 106, the spacer layer 105, the active layer 104, the spacer layer 103, and the lower reflecting mirror 102 of the region where the resist pattern is not formed is removed by the etching. According to the above, the mesa can be formed. The method of etching for forming the mesa may be the dry-etching method or the like. Furthermore, the shape of a top face of the formed mesa may be an approximate square as shown in FIG. 1A, or may be an approximate rectangle, an approximate circle or the like.

The electric current narrowing layer 106 is formed of AlAs. A side surface of the electric current narrowing layer 106 is exposed by forming the mesa, and then a selective oxidation region 106a is formed by treating with steam heat. Specifically, in the selective oxidation, by oxidizing Al included in the electric current narrowing layer 106, $Al_xO_y$ which becomes an insulator is formed, and the selective oxidation region 106a is formed. According to the above process, the electric current narrowing region 106b is formed in a central region which has not been oxidized in the electric current narrowing layer 106.

Moreover, on the side surface of the mesa and the like, a protective layer 112 including SiN and the like is formed. The protective layer 112 is formed by at first forming a SiN layer, forming a resist pattern having an aperture within a region or the like where an upper electrode 121, described later, will be formed on the upper side of the mesa, and removing the SiN layer of the region where the resist pattern is not formed by etching. In this way, in the present exemplary embodiment, since by forming the protective layer 112 on the side face of the mesa and a bottom face around the mesa, the side face of the mesa and the bottom face around the mesa are protected, so that corrosion or the like is inhibited and reliability is improved.

Furthermore, after the above processing, by filling the region, where the SiN layer is removed by the etching when forming the mesa, with a polyimide and planarizing, then removing the polyimide on the upper face of the mesa, a polyimide layer 113 having the polyimide remaining around the mesa is formed.

In the peripheral region outside the adjusting layer 109 formed on the upper side of the mesa, an upper electrode 121 which will be a p-side individual electrode is formed so as to surround the adjusting layer 109. Moreover, on the other side of the substrate 101, a lower electrode 122, which will be an n-side individual electrode, is formed.

Furthermore, on the upper side of the mesa, in the central region surrounded by the upper electrode 121, an upper reflecting mirror 130 is formed. The upper reflecting mirror 130 is formed with a dielectric multiple layer, and formed by alternately laminating dielectric layers, refracting indices of which are different from each other. In the present exemplary embodiment, the upper reflecting mirror 130 is formed by alternately laminating 8.5 pairs of a high refracting ratio layer including $TiO_2$ and a low refracting ratio layer including $SiO_2$.

Accordingly, the surface emitting laser in the present exemplary embodiment, has a configuration in which the resonator region is sandwiched between the lower reflecting mirror 102 and the upper reflecting mirror 130.

In the present exemplary embodiment, since a shape of the adjusting layer 109 in the direction of the X-axis is different from that in the direction of the Y-axis, i.e. the shape of the adjusting layer 109 has different lengths in two mutually perpendicular directions, a confining action in the direction on the plane can have anisotropy. Accordingly, the polarization direction can be controlled to be in a predetermined direction. Moreover, in the present exemplary embodiment, since laser light is emitted from the region where the upper reflecting mirror 130 is formed on the upper side of the mesa, the region emitting the laser light may be denoted as an emitting region.

As described above, the surface emitting laser according to the present exemplary embodiment has the upper reflecting mirror formed of a dielectric material, and can emit laser light with a stable polarization direction in a predetermined direction.

Moreover, the shape of the adjusting layer 109 formed on the upper side of the mesa may be a shape other than that shown in FIG. 1A.

Figure 2:
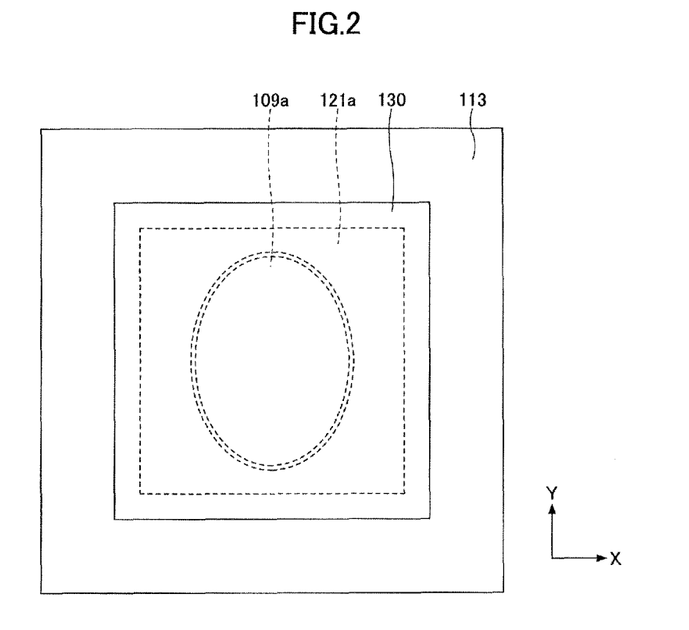
FIG. 2 is an explanatory diagram illustrating another surface emitting laser according to the first exemplary embodiment.

Specifically, as shown in FIG. 2, on the upper side of the mesa, the adjusting layer 109a may be formed so as to have an elliptical shape within the central region. Then, the shape of the adjusting layer 109a is formed so that the major diameter of the ellipse is in the direction of the Y-axis and the minor diameter is in the direction of the X-axis. In this case, the upper electrode 121a is formed so as to correspond to an outer shape of the adjusting layer 109a, and the upper reflecting mirror 130 is formed above the adjusting layer 109a having the elliptical shape in the central region.

Figure 3:
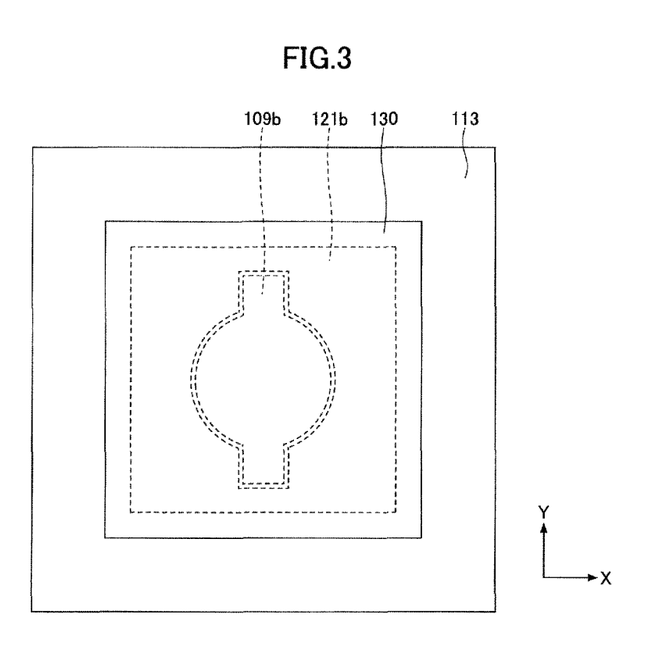
FIG. 3 is an explanatory diagram illustrating yet another surface emitting laser according to the first exemplary embodiment.

Furthermore, as shown in FIG. 3, on the upper side of the mesa, the adjusting layer 109b may be formed so as to have a shape having a circular part and a part extending in the direction of the Y-axis from the circular part. The length in the direction of the Y-axis of the shape is larger than the length in the direction of the X-axis of the shape, i.e. the shape has shape anisotropy (different lengths) in two mutually perpendicular directions. In this case, the upper electrode 121b is formed so as to correspond to the outer shape of the adjusting layer 109b, and the upper reflecting mirror 130 is formed above the adjusting layer 109b in the central region.

As described above, the adjusting layer 109 and the like are formed so as to have a shape in the direction of the X-axis that is different from that in the direction of the Y-axis on the upper face of the mesa, i.e. the shapes on the upper face of the mesa have shape anisotropy in two mutually perpendicular directions.

Furthermore, in the present exemplary embodiment, the upper electrode 121 or the like may overlap on the adjusting layer 109 or the like. In the intra-cavity structure, since the thin contact layer becomes an electric current path, it is preferable that a diameter of the aperture of the upper electrode 121 or the like is as small as possible thereby shortening the path. A width of a part of the overlap may be arbitrarily designed taking account of precision of photolithography or influence of absorption of light by metal.

As described above, in the surface emitting laser according to the present exemplary embodiment, the polarization direction can be made to be a predetermined direction.

Second Exemplary Embodiment

Figure 4:
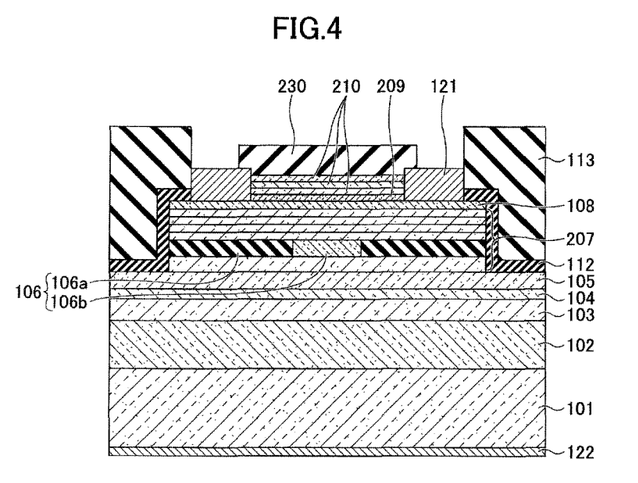
FIG. 4 is an explanatory diagram illustrating a surface emitting laser according to a second exemplary embodiment.

Next, a second exemplary embodiment will be described. FIG. 4 is a cross-sectional diagram of the surface emitting laser according to the present exemplary embodiment.

The surface emitting laser according to the present exemplary embodiment is formed by laminating, on a substrate 101 including a semiconductor or the like, a lower reflecting mirror 102, a spacer layer 103, an active layer 104, a spacer layer 105, a first upper reflecting mirror 207, and a contact layer 108. Moreover, an electric current narrowing layer 106 is formed in a part of the first upper reflecting mirror 207. Furthermore, the semiconductor layers, such as the lower reflecting mirror 102, the spacer layer 103, the active layer 104, the spacer layer 105, the first upper reflecting mirror 207, and the contact layer 108, are formed by epitaxial growth according to MOCVD or MBE.

As the substrate 101, an n-GaAs substrate is used, in which a normal direction of the principal surface is tilted to the crystal orientation <111> by 15 degrees with respect to the crystal orientation <100>.

The lower reflecting mirror 102 is formed with a semiconductor multiple layer, and is formed by alternately laminating 35.5 pairs of a high refraction index layer including n-$Al_{0.16}Ga_{0.84}As$ with an optical thickness of $\lambda/4$ and a low refraction index layer including n-AlAs.

The spacer layers 103 and 105 are formed of $Al_{0.5}Ga_{0.5}As$, the active layer 104 is formed by alternately laminating a GaInAs quantum well layer and a GaInPAs barrier layer. Moreover, the resonator region is formed with the spacer layer 103, the active layer 104 and the spacer layer 105. The resonator region is formed so that the optical thickness of the resonator region is about a wavelength.

Moreover, the first upper reflecting mirror 207 is formed with a semiconductor multiple layer, and formed by alternately laminating 3.5 pairs of a high refracting index layer including p-$Al_{0.16}Ga_{0.84}As$ and a low refracting index layer including p-$Al_{0.9}Ga_{0.1}As$. Furthermore, the contact layer 108 is formed of p-GaAs.

Above the contact layer 108, a wavelength adjusting layer 210 formed by alternately laminating a phase adjusting layer 209, a GaAsP layer and a GaInP layer is formed. In the present exemplary embodiment, by performing photolithography process and etching process as necessary, the wavelength adjusting layer 210 has a predetermined number of layers. Moreover, in the present exemplary embodiment, the phase adjusting layer 209 and the wavelength adjusting layer 210 are formed so as to have approximately the same shape, and to have shape anisotropy on the upper face of the mesa in two mutually perpendicular directions as in the first exemplary embodiment. As described above, the surface emitting laser according to the present exemplary embodiment has a feature such that the adjusting layer 109 exemplified in the first exemplary embodiment is formed with the phase adjusting layer 209 and the wavelength adjusting layer 210.

In the present exemplary embodiment, for example, the phase adjusting layer 209 and the wavelength adjusting layer 210 are formed to have a rectangular shape, similar to the shape of the adjusting layer 109 in the first exemplary embodiment. That is, the phase adjusting layer 209 and the wavelength adjusting layer 210 are formed so as to have an approximately rectangular shape, so that in the plane parallel to the surface of the substrate 101, a length in the Y-axis direction is longer length and a length in the X-axis direction is a shorter length.

Moreover, a mesa is formed by removing the contact layer 108, the first upper reflecting mirror 207 and the electric current narrowing layer 106 and the like by etching. The method of etching for forming the mesa may be dry etching or the like. Furthermore, a shape of the upper face of the formed mesa is formed, e.g., to have an approximately square shape, as in the surface emitting laser in the first exemplary embodiment. Moreover, the shape of the upper face of the mesa may be formed to have a rectangular shape or an elliptic shape, as in the first exemplary embodiment.

The electric current narrowing layer 106 is formed of AlAs. A side surface of the electric current narrowing layer 106 is exposed by forming the mesa, and then a selective oxidation region 106a is formed by treating with steam heat. Specifically, in the selective oxidation, by oxidizing Al included in the electric current narrowing layer 106, $Al_xO_y$, which becomes an insulator is formed, and the selective oxidation region 106a is formed. According to the above process, the electric current narrowing region 106b is formed in a central region which has not been oxidized in the electric current narrowing layer 106.

Moreover, on the side surface of the mesa and the like, a protective layer 112 is formed. In the present exemplary embodiment, the protective layer 112 is formed of SiN. Specifically, the protective layer 112 is formed by forming a SiN layer to form the protective layer 112, forming a resist pattern within the region where the protective layer 112 will be formed, and removing the SiN layer of the region where the resist pattern is not formed by etching. In this way, the protective layer 112 having an aperture on the upper face of the mesa is formed.

Furthermore, in the present exemplary embodiment, since the protective layer 112 is formed on the side face of the mesa and a bottom face around the mesa, and the side face of the mesa and the bottom face around the mesa are protected, corrosion and the like are inhibited and reliability is improved.

Furthermore, after the above processing, by filling the region, where the SiN layer is removed by the etching when forming the mesa, with a polyimide and planarizing, then removing the polyimide on the upper face on the mesa, a polyimide layer 113 having the polyimide remaining around the mesa is formed.

In the peripheral region around the phase adjusting layer 209 and the wavelength adjusting layer 210 formed on the upper face of the mesa, an upper electrode 121 which will be a p-side individual electrode is formed so as to surround the phase adjusting layer 209 and the wavelength adjusting layer 210 on the contact layer 108. Moreover, on the other side of the substrate 101, a lower electrode 122 which will be an n-type individual electrode is formed.

Furthermore, on the upper side of the mesa, in the central region surrounded by the upper electrode 121, a second upper reflecting mirror 230 is formed. The second upper reflecting mirror 230 is formed of a dielectric multiple layer, and formed by alternately laminating dielectric layers, refracting indices of which are different from each other. In the present exemplary embodiment, the second upper reflecting mirror 230 is formed by alternately laminating 8.5 pairs of a high refracting ratio layer including $TiO_2$ and a low refracting ratio layer including $SiO_2$. In the present exemplary embodiment, the upper reflecting mirror is formed with the first upper reflecting mirror 207 and the second upper reflecting mirror 230. Accordingly, the surface emitting laser in the present exemplary embodiment, has a configuration in which the resonator region is sandwiched between the lower reflecting mirror 102 and the first and second upper reflecting mirrors 207 and 230.

As in the above, the surface emitting laser according to the present exemplary embodiment has the upper reflecting mirror, a part of which is formed of a dielectric material, and can emit laser light with a stable polarization direction.

In the present exemplary embodiment, shapes of the phase adjusting layer 209 and of the wavelength adjusting layer 210 in the direction of the X-axis are different from those in the direction of the Y-axis, i.e. the shapes of the phase adjusting layer 209 and of the wavelength adjusting layer 210 have different lengths in two mutually perpendicular directions. Accordingly, a confining action in the direction on the plane can have anisotropy, and the polarization direction can be controlled to be a predetermined direction.

Furthermore, in the surface emitting laser according to the present exemplary embodiment, since a part of the upper reflecting mirror is formed of a semiconductor DBR, a contact layer can be provided on the semiconductor DBR in the upper reflecting mirror. Accordingly, compared with the intra-cavity structure, an electric current path can be expanded, and electric resistance can be reduced.

As described above, in the surface emitting laser according to the present exemplary embodiment, the polarization direction can be a predetermined direction.

Moreover, the structure may be selected from the intra-cavity type as exemplified in the first exemplary embodiment and the structure where a part of the upper reflecting mirror is formed of a semiconductor DBR as exemplified in the present exemplary embodiment, taking into consideration the properties of the semiconductor material used for the semiconductor DBR, required electric resistance, heat dissipation or the like. Furthermore, the phase adjusting layer 209 and the wavelength adjusting layer 210 may be formed in the adjusting layer 109 in the surface emitting laser according to the first exemplary embodiment. Moreover, configurations other than the above-described descriptions are the same as the first exemplary embodiment.

Third Exemplary Embodiment

Next, a third exemplary embodiment will be described. The present exemplary embodiment relates to a surface emitting laser array formed with plural surface emitting lasers, wavelengths of which are different, having the features of the surface emitting laser according to the second exemplary embodiment, and a light transmitting system using the surface emitting laser array.

Figure 5:
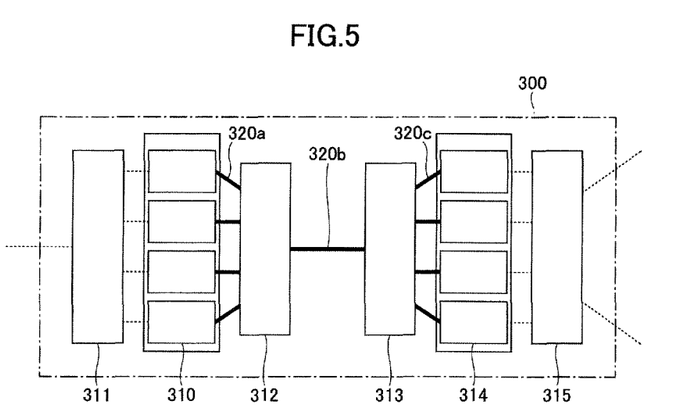
FIG. 5 is a configuration diagram illustrating a light transmitting system according to a third exemplary embodiment.

FIG. 5 illustrates a light transmitting system 300 using a surface emitting laser device, which is a surface emitting laser array according to the present exemplary embodiment. The light emitting system 300 is a light emitting system of a multi-wavelength transmitting scheme, and uses a surface emitting laser array 310 having plural surface emitting lasers, oscillating wavelengths of which are different from each other. Specifically, the light transmitting system has a sending side formed with an electric signal processing portion 311, the surface emitting laser array 310, and a multiplexing portion 312; and a receiving side formed with a demultiplexing portion 313, a light receiving element portion 314, and an electric signal processing portion 315. To the surface emitting laser array 310 the electric signal processing portion 311 is connected, so that emission of laser light from each of the surface emitting lasers in the surface emitting laser array 310 is controlled based on data from the electric signal processing portion 311. The laser light emitted from the surface emitting lasers, the oscillating wavelength of which are different, in the surface emitting laser array 310, enter into the multiplexing portion 312 via optical fibers 320a, are multiplexed in the multiplexing portion 312, and then enter into the demultiplexing portion 313 of the receiving side via an optical fiber 320b. In the demultiplexing portion 313, the entered laser light is demultiplexed for each of the wavelengths. The laser light demultiplexed in the demultiplexing portion 313 enters into the light receiving element portion 314 via optical fibers 320c. Plural light receiving elements are provided in the light receiving element portion 314, the light received at each of the light receiving elements is converted into an electric signal, and then enters into the electric signal processing portion 315. In such a light transmitting system 300, since a surface emitting laser array according to the present exemplary embodiment, described below, is used, transmission of a large amount of data can be performed at high speed.

(Surface Emitting Laser Device)

Figure 6:
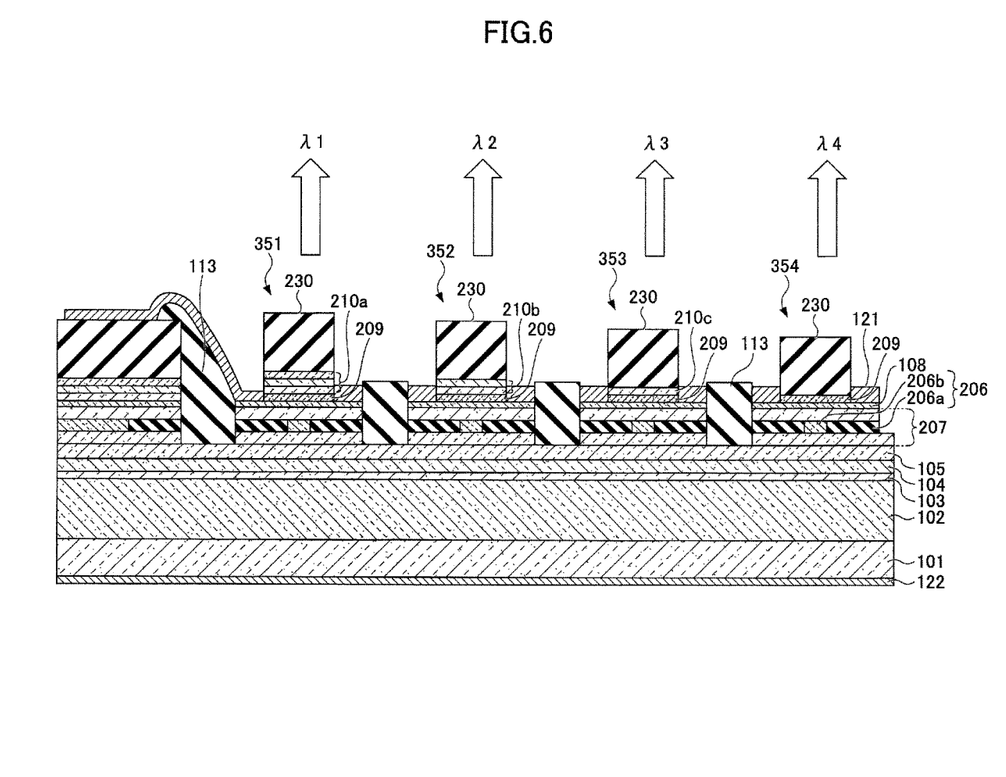
FIG. 6 is a structure diagram illustrating a surface emitting laser array according to the third exemplary embodiment.
Figure 7:
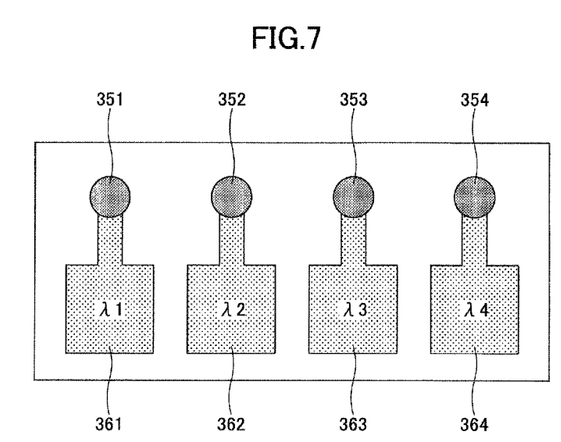
FIG. 7 is a top view illustrating the surface emitting laser array according to the third exemplary embodiment.

Next, the surface emitting laser array according to the present exemplary embodiment will be described. FIG. 6 schematically illustrates a cross-sectional structure of a surface emitting laser chip forming the surface emitting laser device, which will be the surface emitting laser array according to the present exemplary embodiment. FIG. 7 is a top view. The surface emitting laser chip exemplifies a surface emitting laser chip, in which on a chip formed with a semiconductor substrate or the like with a size of 250 μm by 500 μm, four light emitting element portions 351, 352, 353 and 354, each including an emitting laser, are provided. Of the four light emitting element portions 351, 352, 353 and 354, three light emitting element portions 351, 352 and 353 have configurations where wavelength adjusting layers 210a, 210b and 210c are provided, respectively. The light emitting element portion 354 has a configuration where a wavelength adjusting layer is not provided.

Specifically, the surface emitting laser device according to the present exemplary embodiment is formed by laminating, on a substrate 101 including semiconductor or the like, a lower reflecting mirror (DBR) 102, a spacer layer 103, an active layer 104, a spacer layer 105, a first upper reflecting mirror 207, and a contact layer 108. Moreover, an electric current narrowing layer 206 is formed inside of the first upper reflecting mirror 207.

Furthermore, on the contact layer 108, a phase adjusting layer 209 and wavelength adjusting layers 210a, 210b, 210c and the like are formed in a central region of the upper face of a mesa. An upper electrode 121 is formed in peripheral portions around the upper faces of the mesas. Moreover, to the upper electrodes 121 on the light emitting element portions 351, 352, 353 and 354, electric pads 361, 362, 363 and 364 are connected, respectively. That is, the electrode pad 361 is connected to the upper electrode of the light emitting element portion 351, the electrode pad 362 is connected to the upper electrode of the light emitting element portion 352, the electrode pad 363 is connected to the upper electrode of the light emitting element portion 353, and the electrode pad 364 is connected to the upper electrode of the light emitting element portion 354.

Moreover, among the light emitting element portions 351, 352, 353 and 354, a polyimide layer 113 is formed, and on the other side of the substrate 101, a lower electrode 122 is provided.

In the surface emitting laser, which is the light emitting element portion 351, in the central part of the upper face of the mesa the phase adjusting layer 209 and the wavelength adjusting layer 210a are formed. A second upper reflecting mirror 230 is formed by alternately laminating dielectric layers, refracting indices of which are different from each other, on the wavelength adjusting layer 210a. Moreover, in the surface emitting laser, which is the light emitting element portion 352, in the central part of the upper face of the mesa the phase adjusting layer 209 and the wavelength adjusting layer 210b are formed. The second upper reflecting mirror 230 is formed by alternately laminating dielectric layers, refracting indices of which are different from each other, on the wavelength adjusting layer 210b. Furthermore, in the surface emitting laser, which is the light emitting element portion 353, in the central part of the upper face of the mesa the phase adjusting layer 209 and the wavelength adjusting layer 210c are formed. The second upper reflecting mirror 230 is formed by alternately laminating dielectric layers, refracting indices of which are different from each other, on the wavelength adjusting layer 210c. Moreover, in the surface emitting laser, which is the light emitting element portion 354, the wavelength adjusting layer is not formed in the central part of the upper face of the mesa. The second upper reflecting mirror 230 is formed by alternately laminating dielectric layers, refracting indices of which are different from each other, on the phase adjusting layer 209.

In the present exemplary embodiment, the wavelength adjusting layers 210a, 210b and 210c formed on the phase adjusting layers 209 have thicknesses, which are different from each other. Specifically, the wavelength adjusting layer 210a is formed with semiconductor layers having three layers, the wavelength adjusting layer 210b is formed with semiconductor layers having two layers, the wavelength adjusting layer 210c is formed with a semiconductor layer having one layer. Moreover, in the light emitting element portion 354, only the phase adjusting layer 209 is formed, and the wavelength adjusting layer is not formed. Accordingly, lengths of regions, which are resonators, are different from each other, and the wavelengths of light emitted from the four light emitting element portion 351, 352, 353 and 354 are different from each other.

Specifically, from the light emitting element portion 351 laser light with wavelength of $\lambda_1$ is emitted, from the light emitting element portion 352 laser light with wavelength of $\lambda_2$ is emitted, from the light emitting element portion 353 laser light with wavelength of $\lambda_3$ is emitted, and from the light emitting element portion 354 laser light with wavelength of $\lambda_4$ is emitted. Moreover, the wavelengths, $\lambda_1$, $\lambda_2$, $\lambda_3$ and $\lambda_4$ are different from each other.

Furthermore, the wavelength adjusting layers 210a, 210b and 210c are formed, after forming semiconductor layer having three layers, by performing the photolithography process and the etching process as necessary, so that the wavelength adjusting layers 210a, 210b and 210c have different numbers of layers from each other. Accordingly, the wavelength adjusting layers 210a, 210b and 210c can be formed to have different thicknesses from each other.

Fourth Exemplary Embodiment

Next, a fourth exemplary embodiment will be described. The present exemplary embodiment relates to an atomic oscillator (atomic clock) of the CPT (Coherent Population Trapping) type using the cesium D1 line and a surface emitting laser device used for the atomic oscillator or the like.

The atomic oscillator (atomic clock) is an extremely accurate clock. Technologies for reducing a size of the atomic oscillator are being studied. The atomic oscillator is an oscillator based on transition energy of an electron included in an atom of alkali metal or the like. Especially, electron transition energy of an alkali metal atom is found to be quite accurate if the process is not influenced by any disturbance. Accordingly, a stability of frequency, which has been improved by more than several orders of magnitude compared with a crystal oscillator, can be obtained. There are several types of such an atomic oscillator. Above all, the CPT type atomic oscillator provides stability of frequency, precision of which is higher by three orders of magnitude than the crystal oscillator of the related art. Furthermore, it is hoped that size and power consumption of the CPT type atomic oscillator can be reduced.

Figure 8:
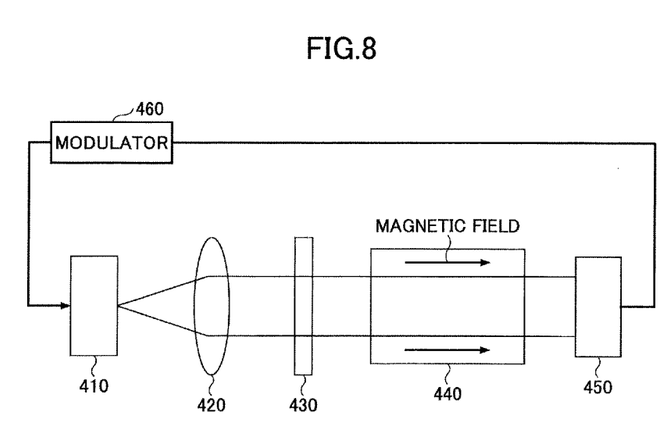
FIG. 8 is a structure diagram illustrating an atomic oscillator according to a fourth exemplary embodiment.

Next, referring to FIG. 8 an atomic oscillator according to the present exemplary embodiment will be described. The atomic oscillator according to the present exemplary embodiment is a small-sized atomic oscillator of the CPT type, including a light source 410, a collimating lens 420, a λ/4 plate 430, an alkali metal cell 440, a light detector 450, and a modulator 460.

As the light source 410, a surface emitting laser device, described later, is used. In the alkali metal cell 440, as an alkali metal, cesium (Cs) atomic gas is encapsulated. The transition to the D1 line is used. For the light detector 450, a photodiode is used.

In the atomic oscillator according to the present exemplary embodiment, light from the light source 410 is irradiated to the alkali metal cell 440, in which the cesium atomic gas is encapsulated. Electrons in cesium atoms are excited. Light transmitted through the alkali metal cell 440 is detected at the light detector 450, a detected signal at the light detector 450 is fed back to the modulator 460, and the surface emitting laser device at the light source 410 is modulated by the modulator.

Figure 9:
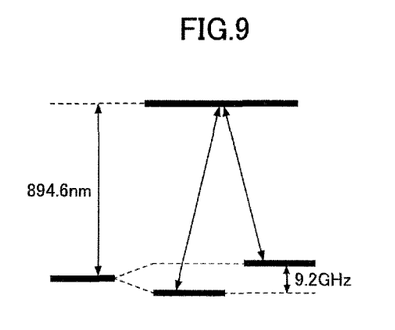
FIG. 9 is an explanatory diagram illustrating atomic energy levels for an explanation of a CPT method.
Figure 10:
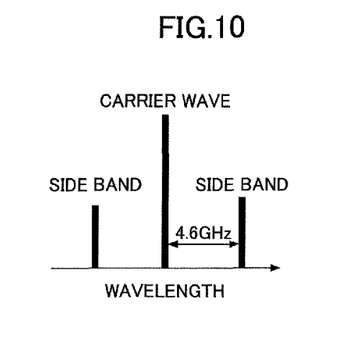
FIG. 10 is an explanatory diagram illustrating wavelength outputted at a modulation of the surface emitting laser.
Figure 11:
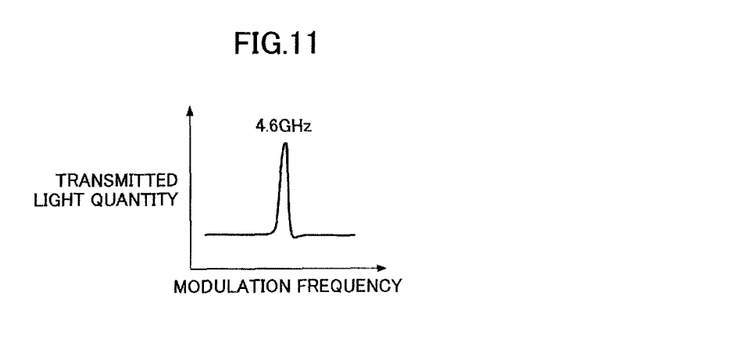
FIG. 11 is a correlation diagram illustrating a correlation between a modulation frequency and a transmitted light quantity.

FIG. 9 illustrates the atomic energy levels related to the CPT type. The atomic oscillator according to the present exemplary embodiment uses the property that when electrons are excited from the two ground levels to the excited level simultaneously, the optical absorptance decreases. For the surface emitting laser which is the light source 410, a surface emitting laser emitting light with a carrier wavelength of about 894.6 nm. The carrier wavelength can be tuned by changing a temperature of the surface emitting laser or the output power. By performing the modulation, other laser lights whose frequencies are deviated from the carrier frequency are generated. As shown in FIG. 10, these laser lights appear as side bands on both sides of the carrier frequency. The modulation is controlled in 4.6 GHz so that the frequency difference between the side bands corresponds to the intrinsic frequency of cesium atom, 9.2 GHz. As shown in FIG. 11, an amount of the laser light transmitted through the excited cesium gas becomes the largest value where the frequency difference between the side bands corresponds to the intrinsic frequency of the cesium atom. The signal from the light detector 450 is fed back to adjust the modulation frequency in the surface emitting laser so as to maintain the largest value of the output from the light detector 450. Since the intrinsic frequency of atom is extremely stable, the modulation frequency becomes a stable value, and the stable data are extracted as an output.

Fine tuning during the operation for the wavelength of the laser light at the surface emitting laser uses temperature dependency and output power dependency of the oscillation wavelength. In this case, for the carrier, wavelength accuracy of a specific wavelength ±1 nm is required. Taking account of productivity, fluctuations of the specified temperature and the output power are preferably the same degree of this accuracy, then an accuracy of about ±0.15 nm is further preferable.

However, it is difficult to produce surface emitting lasers with high reproducibility and with high uniformity and oscillating at the same frequency, according to influences from a variety of growing speeds of the semiconductor layer or the like and of distribution of layer thickness. That is, since a normal MOCVD apparatus or a normal MBE apparatus has a thickness uniformity of layer of about 1 to 2 percent in plane, for the case of the wavelength of 850 nm, distribution in plane of 8.5 to 17 nm occurs. Accordingly, for example, for the use requiring an accuracy of λ±1 nm, a yield ratio of the surface emitting laser becomes extremely low.

The surface emitting laser according to the present exemplary embodiment includes the wavelength adjusting layer in order to increase the yield ratio. For the surface emitting laser, due to the variation of layer thickness in the crystal growth, it is difficult to obtain a uniform oscillating wavelength e.g. within ±1 nm. However, the surface emitting laser array according to the present exemplary embodiment is a surface emitting laser array chip, in which plural surface emitting lasers with different oscillating frequencies are formed in the chip. Then, by selecting a surface emitting laser having an oscillating wavelength close to the desired oscillating wavelength from the surface emitting lasers in the surface emitting laser chip, and using the selected surface emitting laser, laser light with the desired oscillating wavelength can be emitted. Accordingly, the yield ratio of the surface emitting laser can be improved, and an atomic oscillator can be produced and provided at low cost. Such a surface emitting laser device, which can emit laser light with plural wavelengths different from each other in a chip, can be used also for a multiple wavelength transmission or the like, other than the atomic oscillator.

(Surface Emitting Laser Device)

Figure 12:
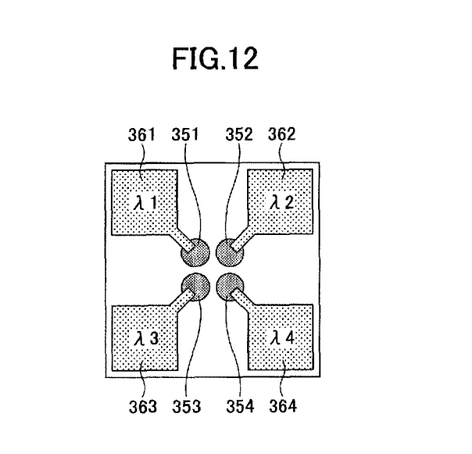
FIG. 12 is a top view illustrating the surface emitting laser array according to the fourth exemplary embodiment.

Next, the surface emitting laser device according to the present exemplary embodiment will be described. FIG. 12 illustrates the top view of the surface emitting laser chip, which is the surface emitting laser device according to the present exemplary embodiment. Moreover, a cross-sectional structure of each of surface emitting lasers in the surface emitting laser chip is the same as the one shown in FIG. 6, except that an arrangement of light emitting element portions 351, 352, 353 and 354, which respectively correspond to the surface emitting lasers, is different. FIG. 6 shows, for reasons of expediency, a state where four light emitting element portions 351, 352, 353 and 354, which are the surface emitting lasers, are arranged horizontally in line. The surface emitting laser chip exemplifies a surface emitting laser chip, including a chip formed of a semiconductor substrate or the like of 300 μm square, and four light emitting element portions 351, 352, 353 and 354, each of which includes a surface emitting laser, are provided on the chip.

Specifically, the surface emitting laser device according to the present exemplary embodiment is formed by laminating, on a substrate 101 including a semiconductor or the like, a lower reflecting mirror (DBR) 102, a space layer 103, an active layer 104, a spacer layer 105, a first upper reflecting mirror 207, and a contact layer 108. Moreover, an electric current narrowing layer 206 is formed inside of the first upper reflecting mirror 207.

Furthermore, on the contact layer 108, in a central portion of a upper face of mesas, a phase adjusting layer 209 and wavelength adjusting layers 210a, 210b, 210c and the like are formed, and in a peripheral region around the upper face of the mesas upper electrodes 121 are formed. To the upper electrodes 121 in the light emitting element portions 351, 352, 353 and 354, electrode pads 361, 362, 363 and 364 are connected, respectively. That is, the electrode pad 361 is connected to the upper electrode of the light emitting element portion 351, the electrode pad 362 is connected to the upper electrode of the light emitting element portion 352, the electrode pad 363 is connected to the upper electrode of the light emitting element portion 353, and the electrode pad 364 is connected to the upper electrode of the light emitting element portion 354.

Moreover, among the light emitting element portions 351, 352, 353 and 354, a polyimide layer 113 is formed, and on the other side of the substrate 101, a lower electrode 122 is provided.

In the surface emitting laser, which is the light emitting element portion 351, in the central portion of an upper face of the mesa, the phase adjusting layer 209 and the wavelength adjusting layer 210a are formed. The second upper reflecting mirror 230 is formed by alternately laminating dielectric layers, refracting indices of which are different from each other, on the wavelength adjusting layer 210a. Moreover, in the surface emitting laser, which is the light emitting element portion 352, in the central portion of an upper face of the mesa, the phase adjusting layer 209 and the wavelength adjusting layer 210b are formed. The second upper reflecting mirror 230 is formed by alternately laminating dielectric layers, refracting indices of which are different from each other, on the wavelength adjusting layer 210b. Furthermore, in the surface emitting laser, which is the light emitting element portion 353, in the central portion of upper face of the mesa, the phase adjusting layer 209 and the wavelength adjusting layer 210c are formed. The second upper reflecting mirror 230 is formed by alternately laminating dielectric layers, refracting indices of which are different from each other, on the wavelength adjusting layer 210c. Moreover, in the surface emitting laser, which is the light emitting element portion 354, the wavelength adjusting layer is not formed in the central portion of upper face of the mesa. The second upper reflecting mirror 230 is formed by alternately laminating dielectric layers, refracting indices of which are different from each other, on the phase adjusting layer 209.

In the present exemplary embodiment, the wavelength adjusting layers 210a, 210b and 210c formed on the phase adjusting layer 209 have thicknesses which are different from each other. Specifically, the wavelength adjusting layer 210a is formed with a semiconductor layer having three layers, the wavelength adjusting layer 210b is formed with a semiconductor layer having two layers, and the wavelength adjusting layer 210c is formed with a semiconductor layer having one layer. Moreover, in the light emitting element portion 354, only the phase adjusting layer 209 is formed, and the wavelength adjusting layer is not formed. Accordingly, lengths of regions, which are resonators, are different from each other, and the wavelengths of light emitted from the four light emitting element portion 351, 352, 353 and 354 are different from each other.

Specifically, from the light emitting element portion 351 laser light with wavelength of $\lambda_1$ is emitted, from the light emitting element portion 352 laser light with wavelength of $\lambda_2$ is emitted, from the light emitting element portion 353 laser light with wavelength of $\lambda_3$ is emitted, and from the light emitting element portion 354 laser light with wavelength of $\lambda_4$ is emitted. Moreover, the wavelengths, $\lambda_1, \lambda_2, \lambda_3$ and $\lambda_4$ are different from each other.

Furthermore, the wavelength adjusting layers 210a, 210b and 210c are formed, after forming semiconductor layer having three layers, by performing a photolithography process and an etching process as necessary, so that the wavelength adjusting layers 210a, 210b and 210c have different numbers of layers from each other. Accordingly, the wavelength adjusting layers 210a, 210b and 210c can be formed to have different thicknesses from each other.

Figure 13:
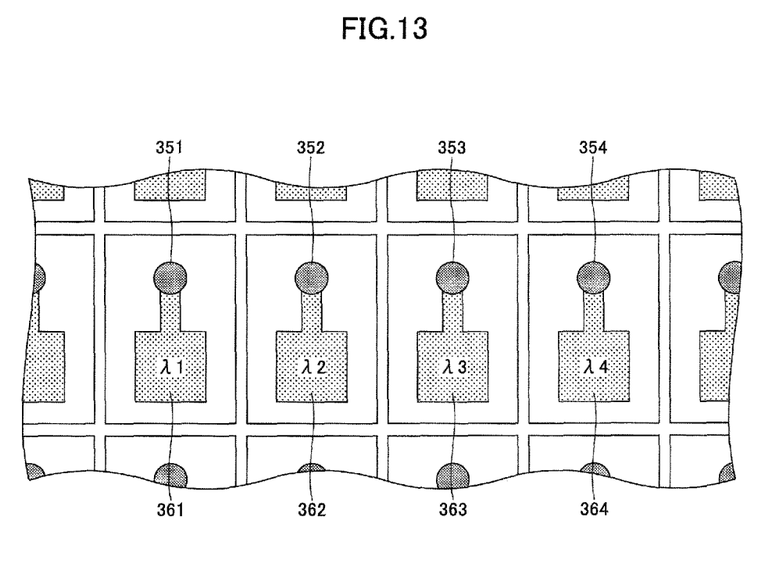
FIG. 13 is an explanatory diagram illustrating the surface emitting laser according to the fourth exemplary embodiment.

Furthermore, the light emitting element portions 351, 352, 353 and 354, which emit light with different wavelengths from each other, may be arranged cyclically on a wafer, as shown in FIG. 13. Moreover, each of the light element portions 351, 352, 353 and 354 may be a chip. In this case, a size of each chip may be e.g. 250 μm by 150 μm. Moreover, from the light emitting element portion 351 laser light with wavelength of $\lambda_1$ is emitted, from the light emitting element portion 352 laser light with wavelength of $\lambda_2$ is emitted, from the light emitting element portion 353 laser light with wavelength of $\lambda_3$ is emitted, and from the light emitting element portion 354 laser light with wavelength of $\lambda_4$ is emitted.

As described above, laser light irradiated to the alkali metal cell 440 is required to have a circular polarization for the CPT resonance. The surface emitting laser device according to the present exemplary embodiment can emit a linearly-polarized laser light, with polarization directions being aligned, which is required to generate the circular polarization at the λ/4 plate, since the polarization direction is controlled as in the surface emitting laser device according to the second exemplary embodiment.

Furthermore, in the surface emitting laser device according to the present exemplary embodiment, in each of the light emitting element portions 351, 352, 353 and 354, the numbers of layers, i.e. total thicknesses, of the wavelength adjusting layers 210a, 210b and 210c included in the resonator region are different from each other. Accordingly, from the light emitting element portions 351, 352, 353 and 354, laser lights, wavelengths of which are different from each other, are emitted. That is, from the light emitting element portion 351 laser light with wavelength of $\lambda_1$ is emitted, from the light emitting element portion 352 laser light with wavelength of $\lambda_2$ is emitted, from the light emitting element portion 353 laser light with wavelength of $\lambda_3$ is emitted, and from the light emitting element portion 354 laser light with wavelength of $\lambda_4$ is emitted. Moreover, the wavelengths, $\lambda_1$, $\lambda_2$, $\lambda_3$ and $\lambda_4$ are different from each other. Accordingly, in the surface emitting laser chip, which is the surface emitting laser device according to the present exemplary embodiment, a light emitting element portion emitting laser light with a wavelength, which is the closest to 894.6 nm, can be selected from the light emitting element portions 351, 352, 353 and 354, and can be used. According to the above process, a probability of existence of a light emitting element portion, which can be used even in the case where the distribution in plane occurs during producing the surface emitting laser, is enhanced, and the yield ratio can be improved by almost four times. By using the surface emitting laser device according to the present exemplary embodiment, explained as above, the yield ratio of an atomic oscillator using the CPT method can be improved and the atomic oscillator can be produced at a low cost.

Moreover, in the present exemplary embodiment, cesium (Cs) is used as the alkali metal, and the surface emitting laser for the wavelength of 894.7 nm in order to use the transition to the D1 line of cesium is exemplified. However, the present invention is not limited to this. Laser light with a wavelength of 852.3 nm may be used in order to use the D2 line of cesium. Furthermore, as the alkali metal rubidium (Rb) may be used, and laser light with a wavelength of 795.0 nm may be used in order to use the D1 line, and laser light with a wavelength of 780.2 nm may be used in order to use the D2 line. In this case, by adjusting the composition of materials or the like in the active layer, laser light with the desired wavelength can be emitted. Furthermore, in the case of using rubidium, the modulating frequency is 3.4 GHz for $^{87}$Rb and 1.5 GHz for $^{85}$Rb.

Further, the present invention is not limited to these embodiments, but various variations and modifications may be made without departing from the scope of the present invention.

The present application is based on Japanese Priority Application No. 2012-262757 filed on Nov. 30, 2012, with the Japanese Patent Office, the entire contents of which are hereby incorporated by reference.

What is claimed is:

1. A surface emitting laser device, comprising:
a substrate;
a lower reflecting mirror provided on the substrate;
an active layer provided on the lower reflecting mirror;
an upper reflecting mirror provided on the active layer, the upper reflecting mirror being formed by alternately laminating dielectrics, refracting indices of the dielectrics being different from each other;
an adjusting layer formed of semiconductor, provided in an emitting region between the active layer and the upper reflecting mirror, laser light being emitted from the emitting region, wherein
a shape of the adjusting layer in a plane parallel to a surface of the substrate has shape anisotropy in two mutually perpendicular directions;
a spacer layer provided between the active layer and the upper reflecting mirror;
a contact layer formed of semiconductor, provided between the spacer layer and the upper reflecting mirror; and
an electrode connected to the contact layer, wherein the adjusting layer is provided between the contact layer and the upper reflecting mirror.

2. The surface emitting laser device as claimed in claim 1, wherein the adjusting layer includes a wavelength adjusting layer formed by laminating materials, a number of kinds of the materials being more than or equal to two.

3. The surface emitting laser device as claimed in claim 2, further comprising:
a plurality of surface emitting lasers, each of which includes the substrate, the lower reflecting mirror, the active layer, the upper reflecting mirror, and the adjusting layer, wherein wavelengths of laser light emitted by the respective surface emitting lasers are made different from each other by changing a thickness of the adjusting layer.

4. The surface emitting laser device as claimed in claim 2, wherein the adjusting layer is formed by alternately laminating two kinds of semiconductor layers, and
a thickness of the adjusting layer changes by removing a part of layer at each layer of the laminated semiconductor layers.

5. The surface emitting laser device as claimed in claim 1, wherein the substrate is a substrate, in which a normal direction of a principal surface is tilted to a crystal orientation <111> with respect to a crystal orientation <100>.

6. The surface emitting laser device as claimed in claim 1, wherein a wavelength of the laser light is one of 780.2 nm, 795.0 nm, 852.3 nm and 894.6 nm.

7. An atomic oscillator, comprising:
the surface emitting laser device as claimed in claim 1;
an alkali metal cell that encapsulates alkali metal;
a light detecting unit that detects light transmitted through the alkali metal cell, the light being emitted from a surface emitting laser of the surface emitting laser device; and
a modulating unit that modulates the surface emitting laser device, wherein
a signal outputted from the light detecting unit is transmitted to the modulating unit, and
the modulating unit modulates the surface emitting laser device with a modulating frequency, which is determined based on a transmitted light quantity detected by the light detecting unit.

8. A surface emitting laser device, comprising:
a substrate;
a lower reflecting mirror provided on the substrate;
an active layer provided on the lower reflecting mirror;

a first upper reflecting mirror provided on the active layer, the first upper reflecting mirror being formed by alternately laminating semiconductors, refracting indices of the semiconductors being different from each other;

a second upper reflecting mirror provided on the first upper reflecting mirror, the second upper reflecting mirror being formed by alternately laminating dielectrics, refracting indices of the dielectrics being different from each other;

an adjusting layer formed of semiconductor, provided in an emitting region between the first upper reflecting mirror and the second upper reflecting mirror, laser light being emitted from the emitting region, wherein a shape of the adjusting layer in a plane parallel to a surface of the substrate has shape anisotropy in two mutually perpendicular directions;

a contact layer formed of semiconductor, provided between the first upper reflecting mirror and the second upper reflecting mirror; and an electrode connected to the contact layer, wherein the adjusting layer is provided between the contact layer and the second upper reflecting mirror.

9. The surface emitting laser device as claimed in claim 8, wherein the adjusting layer includes a wavelength adjusting layer formed by laminating materials, a number of kinds of the materials being more than or equal to two.

10. The surface emitting laser device as claimed in claim 9, further comprising:

a plurality of surface emitting lasers, each of which includes the substrate, the lower reflecting mirror, the active layer, the first upper reflecting mirror, the second upper reflecting mirror, and the adjusting layer, wherein wavelengths of laser light emitted by the respective surface emitting lasers are made different from each other by changing a thickness of the adjusting layer.

11. The surface emitting laser device as claimed in claim 9, wherein the adjusting layer is formed by alternately laminating two kinds of semiconductor layers, and a thickness of the adjusting layer changes by removing a part of layer at each layer of the laminated semiconductor layers.

12. The surface emitting laser device as claimed in claim 8, wherein the substrate is a substrate, in which a normal direction of a principal surface is tilted to a crystal orientation <111> with respect to a crystal orientation <100>.

13. The surface emitting laser device as claimed in claim 8, wherein a wavelength of the laser light is one of 780.2 nm, 795.0 nm, 852.3 nm and 894.6 nm.

* * * * *